(12) United States Patent
Saitoh

(10) Patent No.: US 6,288,908 B1
(45) Date of Patent: Sep. 11, 2001

(54) PERIPHERAL APPARATUS FOR PC CARDS

(75) Inventor: Yoshiyuki Saitoh, Yamagata (JP)

(73) Assignee: Nec Corporation, Tokyo (JP)

( * ) Notice: Subject to any disclaimer, the term of this patent is extended or adjusted under 35 U.S.C. 154(b) by 0 days.

(21) Appl. No.: 09/442,745

(22) Filed: Nov. 18, 1999

(30) Foreign Application Priority Data

Nov. 20, 1998 (JP) ................................. 10-331298

(51) Int. Cl.$^7$ ................................................. H01R 23/68
(52) U.S. Cl. ............................................ 361/785; 439/79
(58) Field of Search ................................... 361/785, 737, 361/683, 686, 753, 752; 439/64, 59, 79, 945

(56) References Cited

U.S. PATENT DOCUMENTS

| | | | |
|---|---|---|---|
| 5,499,162 | * | 3/1996 | Bartuska et al. ...................... 361/737 |
| 5,752,857 | * | 5/1998 | Knights ................................... 73/638 |
| 5,889,649 | * | 3/1999 | Nabetani et al. ...................... 361/684 |
| 6,097,605 | * | 8/2000 | Klatt et al. ............................ 361/737 |

FOREIGN PATENT DOCUMENTS

| | | |
|---|---|---|
| 4-333909 | 11/1992 | (JP) . |
| 9-289065 | 11/1997 | (JP) . |

* cited by examiner

*Primary Examiner*—Tulsidas Patel
(74) *Attorney, Agent, or Firm*—McGuireWoods LLP

(57) ABSTRACT

A peripheral apparatus for personal computer (PC) cards, which decreases the limit of the components installing height on a printed circuit board (PCB) of a PC by changing the installing position of a PC card slot unit, is provided. Two connectors are provided. A first connector is fixed to the PCB and a second connector is fixed to the PC card slot unit. And these two connectors are connected at a state that the two connectors can be de-connected in the opposite direction of inserting PC cards. A slot of the first connector is provided in the horizontal direction and the first connector is fixed at the end side of the PCB. The second connector is made of a card edge type PCB and this card edge type PCB is inserted to the slot of the first connector. The PC card slot unit is connected to the PCB in a cabinet of the PC at a state that the PC card slot unit is placed in the horizontal direction at the outside of the cabinet of the PC.

9 Claims, 2 Drawing Sheets

PERIPHERAL APPARATUS FOR PC CARDS

BACKGROUND OF THE INVENTION

The present invention relates to a peripheral apparatus for personal computer (PC) cards, which is used for connecting PC cards to a PC such as a laptop type PC and a note type PC.

DESCRIPTION OF THE RELATED ART

Especially, at a laptop type PC or a note type PC in personal computers, the cabinet of the note type PC is sized small, consequently, when a modulator-demodulator (MODEM) for data communication or a memory is additionally installed, installing them in the cabinet may have difficulty in size.

In order to avoid the difficulty, recently the MODEM or the additional memory is installed in the PC card. And the PC card is inserted to a slot of a PC card slot unit that is mounted on a printed circuit board (PCB) of the PC, and the PC card connects to the PC via connectors. In this, the PC card slot unit is designed to meet the peripheral component interconnect (PCI) bus system recommended by the personal computer memory card international association (PCMCIA).

FIG. 1 is a perspective view illustrating a conventional peripheral apparatus for PC cards. As shown in FIG. 1, at the conventional peripheral apparatus for PC cards, a PC card slot unit 11 is installed together with other components on a PCB 21 of a PC. On the side part of the PCB 21, an area for installing the PC card slot unit 11 is reserved and the PC card slot unit 11 is fixed on the PCB 2 with screws inserting to screw holes 21a of the PCB 21.

The PC card slot unit 11 installed on the PCB 21 is electrically connected to the PCB 21 with connectors 31a and 31b. As shown in FIG. 1, from the positioning relation between the PC card slot unit 11 and the PCB 21, one connector 31a, whose slot 31c is made to be upward, is fixed on the PCB 21, and the other connector 31b attached to the PC card slot unit 11 is made to be downward, and the PC card slot unit 11 is installed on the PCB 21. In this, a PC card is inserted to a PC card inserting slot 11a of the PC card slot unit 11.

However, as shown in FIG. 1, at the conventional peripheral apparatus for PC cards, the PC card slot unit 11 is installed together with other components on the PCB 21 of the PC. On the side part of the PCB 21, an area for installing the PC card slot unit 11 is reserved and the PC card slot unit 11 is fixed on the PCB 21 with screws inserting to the screw holes 21a of the PCB 21. Consequently, the connectors 31a and 31b are placed between the PC card slot unit 11 and the PCB 21, and the space putting the connectors 31a and 31b and the PC card slot unit 11 on the PCB 21 is required.

At the laptop type PC or the note type PC, especially, the height of the cabinet is required to be low. As shown in FIG. 1, at the conventional PC, the height putting the connectors 31a and 31b and the PC card slot unit 11 must be obtained. This causes a problem that the height can not be made to be low.

SUMMARY OF THE INVENTION

It is therefore an object of the present invention to provide a peripheral apparatus for PC cards that makes the influence giving to the height of a PC as small as possible.

According to a first aspect of the present invention, for achieving the object mentioned above, there is provided a peripheral apparatus for personal computer (PC) cards, which provides a PC card slot unit connecting to a printed circuit board (PCB) of a PC through connectors and is used by inserting PC cards to the PC card slot unit. And the connectors are constituted of a first connector fixed to the PCB and a second connector fixed to the PC card slot unit, and the first connector and the second connector are connected in a state that the both connectors can be de-connected in the opposite direction of inserting direction of PC cards, and the PC card slot unit is provided at the outside of a cabinet of the PC.

According to a second aspect of the present invention in the first aspect, a slot of the first connector is provided in the horizontal direction at the end side of the PCB, and the second connector is made of a card edge type PCB and the card edge type PCB is inserted to the slot of the first connector.

According to a third aspect of the present invention in the first aspect, the PC card slot unit is placed at the outside of the cabinet of the PC and connected to the PCB through the connectors in the horizontal direction.

According to a fourth aspect of the present invention in the first aspect, the maximum number of the PC cards inserting to the PC card slot unit is three at the same time.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
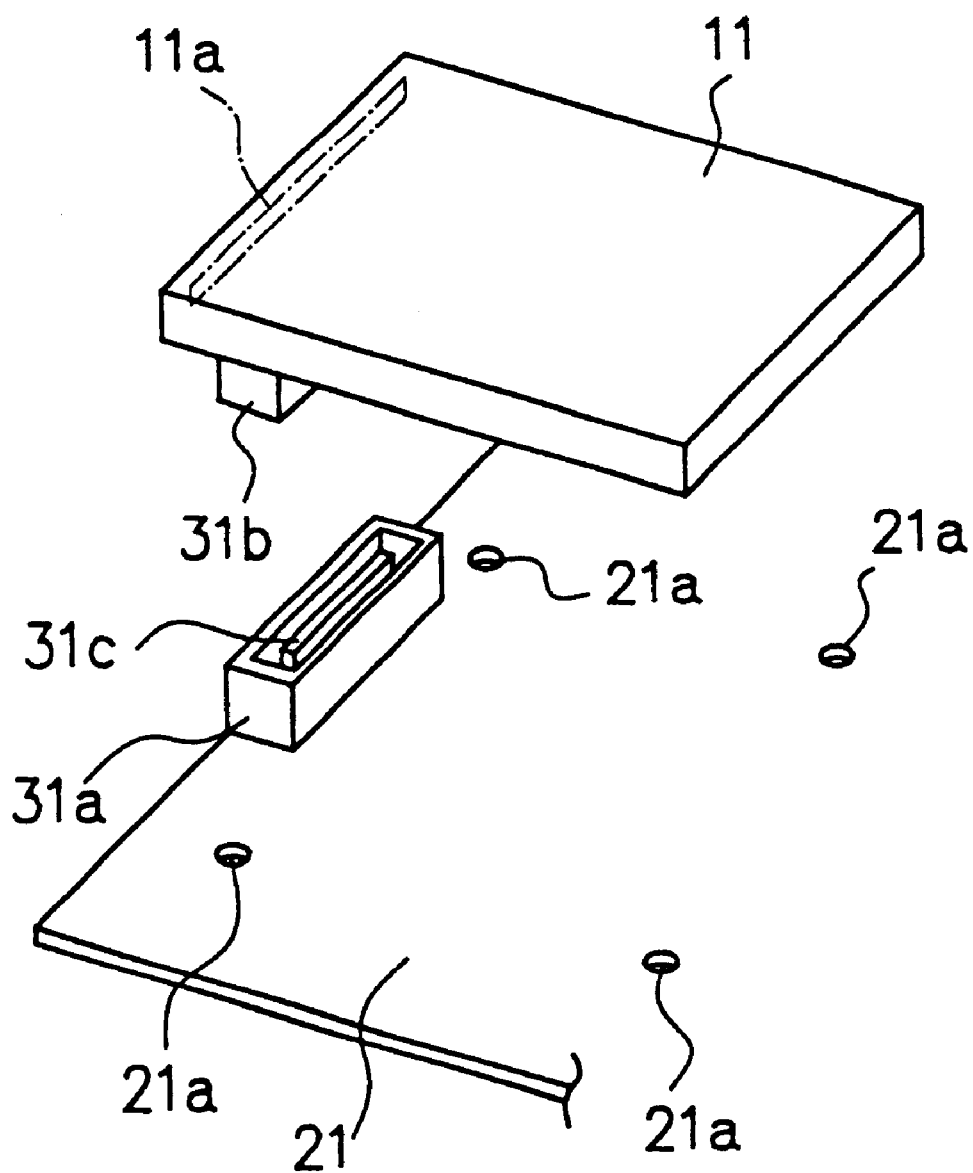
FIG. 1 is a perspective view illustrating a conventional peripheral apparatus for PC cards.
Figure 2:
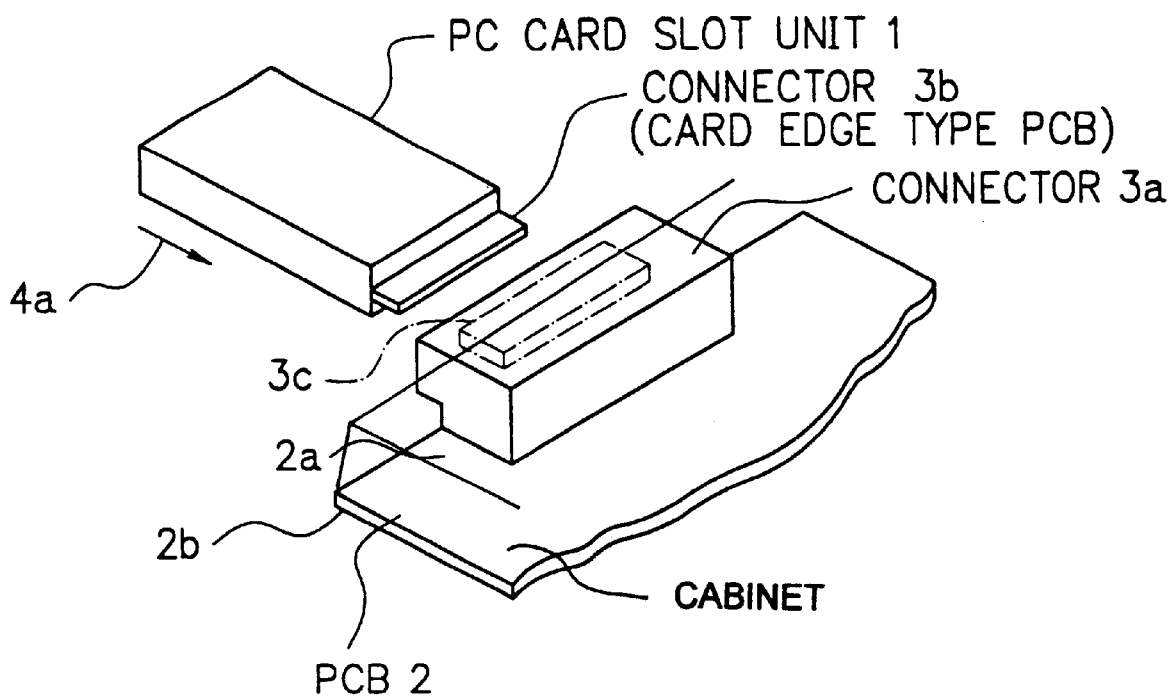
FIG. 2 is a perspective view illustrating an embodiment of a peripheral apparatus for PC cards of the present invention.

Referring now to the drawings, an embodiment of the present invention is explained in detail. FIG. 2 is a perspective view illustrating an embodiment of a peripheral apparatus for PC cards of the present invention. And FIG. 3 is a sectional view illustrating a part of the peripheral apparatus for PC cards of the present invention.

Figure 3:
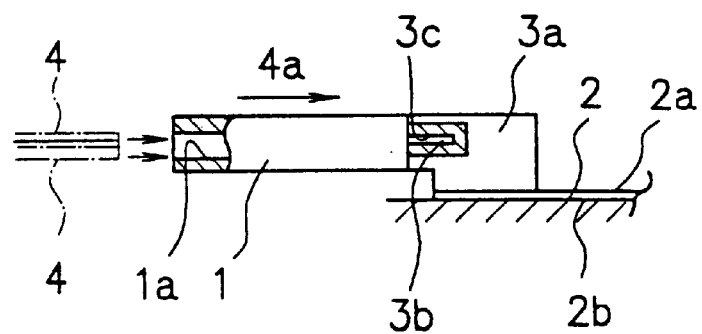
FIG. 3 is a sectional view illustrating a part of the peripheral apparatus for PC cards of the present invention.

As shown in FIG. 2, at the embodiment of the peripheral apparatus for PC cards of the present invention, a PC card slot unit 1 is connected to a PCB 2 via connectors 3a and 3b, and a PC card 4 is inserted to a slot 1a of the PC card slot unit 1 shown in FIG. 3.

The connector 2a is fixed on the PCB 2 and the connector 2b is fixed to the PC card slot unit 1. The connectors 2a and 2b connect at a state that the both connectors are easily disconnected in the opposite direction of an inserting direction 4a of the PC card 4.

The connector 3a provides a slot 3c and the slot 3c is formed in the horizontal direction and the connector 3a is fixed at the end side of the PCB 2. The connector 3b is made of a card edge type PCB and is inserted to the slot 3c of the connector 3a.

The card edge type PCB of the connector 3b is snaped as a tongue, and electrodes (not shown) are provided in parallel to the inserting direction 4a on one surface or both surfaces of the card edge type PCB. At the slot 3c of the connector 3a, electrodes electrically connecting one by one to the electrodes of the card edge type PCB of the connector 3b are provided.

The PC cart slot unit 1 positioned at the outside of the cabinet of the PC connects to the cabinet of the PC through the connectors 3a and 3b in the horizontal direction.

The PC card slot unit 1 provides the slot 1a on the opposite side of the connector 3b being the card edge type PCB, and the PC card 4 is inserted to the slot 1a.

At the embodiment of the present invention, the PC card slot unit 1 is connected to the PCB 2 by inserting the connector 3b being the card edge type PCB to the slot 3c of the connector 3a.

When the PC card slot unit 1 is connected to the PCB 2, the PC card slot unit 1 is not installed at the place of both surfaces 2a and 2b of the PCB 2. Therefore the height of the cabinet of the PC is not influenced by the height of the PC card slot unit 1. Consequently, the designing of the PC has some degree of freedom.

As mentioned above, when the PC card slot unit 1 is placed at the outside of the cabinet of the PC in the connecting state, the limit of the components mounting height on the PCB 2 is lowered and the degree of freedom for designing increases. Therefore, the thickness of laptop or note type PC can be decreased.

Moreover, as shown in FIG. 3, the PC card slot unit 1 is connected to the PCB 2 at the state that the PC card slot unit 1 is floated from the PCB 2 by connecting with the connectors 3a and 3b. And there is an open space under the PC card slot unit 1, therefore the thickness of the PC card slot unit 1 can be increased by utilizing the open space and the number of PC cards 4 inserting to the slot 1a can be increased. At the case of FIGS. 2 and 3, the number of PC cards 4 inserting to the slot 1a is two, but three PC cards can be inserted. When the three PC cards are inserted to the slot 1a of the PC card slot unit 1, connectors 3a and 3b are designed to meet the requirement being capable of inserting three PC cards.

As mentioned above, according to the present invention, the components installing height of the PCB is not limited by connecting the PC card slot unit. The degree of freedom for designing the components installing height of the PCB increases and the height of the laptop or note type PC is not limited by the height of the PC card slot unit.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A peripheral apparatus for personal computer (PC) cards, which provides a PC card slot unit connecting to a printed circuit board (PCB) of a PC through connectors and is used by inserting PC cards to said PC card slot unit, wherein:

said connectors include a first connector fixed to said PCB and a second connector fixed to said PC card slot unit;

said first connector and said second connector are connected in a state that said both connectors can be disconnected in the opposite direction of an inserting direction of PC cards; and said first connector extending to an outside of a cabinet of said PC such that said second connector of said PC card slot unit is connected on the outside of the cabinet of said PC to said first connector of said PCB.

2. A peripheral apparatus for PC cards in accordance with claim 1, wherein:

a slot of said first connector is provided in the horizontal direction at the end side of said PCB; and said second connector is made of a card edge type PCB and said card edge type PCB is inserted to said slot of said first connector.

3. A peripheral apparatus for PC cards in accordance with claim 1, wherein:

said PC card slot unit is placed at the outside of said cabinet of said PC and connected to said PCB through said connectors in the horizontal direction.

4. A peripheral apparatus for PC cards in accordance with claim 1, wherein:

the maximum number of said PC cards inserting to said PC card slot unit is three at the same time.

5. A peripheral apparatus for PC cards in accordance with claim 1, further comprising an L-shaped housing for housing the first connector of said PCB.

6. A peripheral apparatus for PC cards in accordance with claim 5, wherein a leg of said L-shaped housing extends beyond an edge of said PC and outside of said cabinet.

7. A peripheral apparatus for PC cards in accordance with claim 6, wherein said first connector is a slot within said L-shaped housing and said second connector is an edge type connector.

8. A peripheral apparatus for PC cards in accordance with claim 7, wherein said slot is substantially parallel with a surface of said PCB.

9. A peripheral apparatus for PC cards in accordance with claim 1, wherein said PCB card slot unit is floated from said PCB.

* * * * *